United States Patent
Wu et al.

(10) Patent No.: US 9,728,545 B2
(45) Date of Patent: Aug. 8, 2017

(54) METHOD FOR PREVENTING FLOATING GATE VARIATION

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/688,006

(22) Filed: Apr. 16, 2015

(65) Prior Publication Data

US 2016/0307911 A1    Oct. 20, 2016

(51) Int. Cl.

| H01L 29/423 | (2006.01) |
|---|---|
| H01L 21/28 | (2006.01) |
| H01L 27/105 | (2006.01) |
| H01L 29/66 | (2006.01) |
| H01L 29/06 | (2006.01) |
| H01L 27/11521 | (2017.01) |
| H01L 27/11526 | (2017.01) |
| H01L 27/11548 | (2017.01) |
| H01L 27/11519 | (2017.01) |

(52) U.S. Cl.
CPC .. *H01L 27/11548* (2013.01); *H01L 21/28273* (2013.01); *H01L 27/11519* (2013.01); *H01L 27/11526* (2013.01); *H01L 29/42328* (2013.01); *H01L 29/66825* (2013.01); *H01L 27/11521* (2013.01)

(58) Field of Classification Search
CPC ......... H01L 27/11548; H01L 27/11521; H01L 27/11526; H01L 21/28273; H01L 29/42328; H01L 29/66825; H01L 27/11519
USPC .................................................. 257/315–330
See application file for complete search history.

(56) References Cited

U.S. PATENT DOCUMENTS 6,380,031 B1   4/2002 Mehrad et al.
6,501,123 B2   12/2002 Liu
(Continued)

FOREIGN PATENT DOCUMENTS

TW        201327727 A1    7/2013

*Primary Examiner* — Marcos D Pizarro Crespo
*Assistant Examiner* — Nelson Garces
(74) *Attorney, Agent, or Firm* — Eschweiler & Potashnik, LLC

(57) ABSTRACT

A method for manufacturing an embedded flash memory device is provided. Memory and logic shallow trench isolation (STI) regions respectively extend into memory and logic regions of a substrate. The memory and logic STI regions have upper surfaces approximately coplanar with an upper surface of a pad layer overlying the substrate. A capping layer is formed overlying the logic region. A first etch is performed into the pad layer to expose memory gaps between the memory STI regions. A floating gate layer is formed filling the memory gaps. A second, dry etch is performed into the floating gate layer to etch the floating gate layer back to below upper surfaces of the capping layer and the memory STI regions. A third etch is performed into the memory STI regions to recess the memory STI regions. A fourth etch is performed into the floating gate layer to form floating gates.

20 Claims, 10 Drawing Sheets

(56) References Cited

U.S. PATENT DOCUMENTS

| | | |
|---|---|---|
| 7,056,791 B2 | 6/2006 | Shyu et al. |
| 8,068,370 B2 | 11/2011 | Lue |
| 9,082,866 B2 | 7/2015 | Sakaguchi et al. |
| 9,293,204 B2 | 3/2016 | Do et al. |
| 2004/0147099 A1 | 7/2004 | Hashimoto et al. |
| 2015/0072522 A1 | 3/2015 | Jung |
| 2015/0091075 A1 | 4/2015 | Nishitani et al. |
| 2016/0181261 A1* | 6/2016 | Wu .................. H01L 27/11521 257/316 |

* cited by examiner

METHOD FOR PREVENTING FLOATING GATE VARIATION

BACKGROUND

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device is an embedded flash memory device. An embedded flash memory device includes an array of flash memory cells and logic devices supporting operation of the flash memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
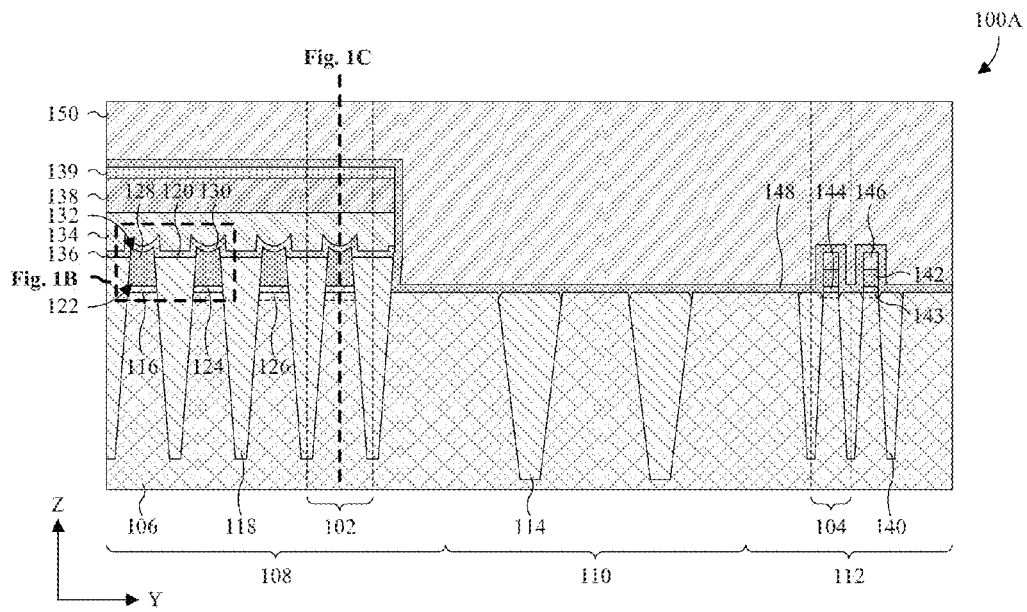
FIG. 1A illustrates a cross-sectional view of some embodiments of an embedded flash memory device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

An embedded flash memory device includes an array of flash memory cell devices and logic devices supporting operation of the flash memory cell devices. Common types of flash memory cell devices include stacked-gate flash memory cell devices and split-gate flash memory devices (e.g., third generation SUPERFLASH (ESF3) memory cell devices). Compared to stacked-gate flash memory cell devices, split-gate flash memory cell devices have lower power consumption, higher injection efficiency, less susceptibility to short channel effects, and over erase immunity. As such, split-gate flash memory cell devices are more prevalent. Common types of logic devices include address decoders and read/write circuitry.

According to some methods for manufacturing an ESF3-based embedded flash memory device, shallow trench isolation (STI) regions are formed laterally spaced over a semiconductor substrate, and with upper surfaces elevated relative to an upper surface of the semiconductor substrate. Thereafter, a floating gate layer is formed over the semiconductor substrate and the STI regions, and filling gaps between the STI regions. With the floating gate layer formed, a chemical mechanical polish (CMP) is performed into the floating gate layer to about even with the upper surfaces of the STI regions. The CMP forms floating gate lines within the gaps, and a subsequent etch forms individual floating gates from the floating gate lines. Advantageously, the foregoing methods form the floating gates with a self-aligned process. However, the self-aligned process limits the process window.

One solution to alleviate the process window limits is to form a capping layer over a logic region of the semiconductor substrate before forming the floating gate layer. The logic region is typically arranged along the periphery of the semiconductor substrate, around a memory region of the substrate within which the STI regions are arranged. After forming the capping layer, the floating gate layer is formed and a CMP is performed to about even with upper surfaces of the STI regions and the capping layer. However, despite alleviating process window limits, the solution may introduce variations to thicknesses of the floating gates. Such variations may be, for example, about 50-70 angstroms. The upper surface of the capping layer is typically elevated relative to the upper surfaces of the STI regions, so the CMP head may be at an angle relative to the horizontal plane and/or peripheral regions of the CMP head may be elevated relative to central regions of the CMP head.

In view of the foregoing, the present application is directed to an improved method for manufacturing an ESF3-based embedded flash memory device that does not suffer from variations in floating gate thickness. According to the method, a semiconductor substrate with a memory region and a logic region is provided. STI regions are formed laterally spaced over the memory region, and with upper surfaces elevated relative to an upper surface of the semiconductor substrate. Further, a capping layer is formed over the logic region with an upper surface elevated relative to the upper surfaces of the STI regions. Thereafter, a floating gate layer is formed over the semiconductor substrate, the STI regions, and the capping layer, and filling gaps between the STI regions. The gaps cause concave recesses in an upper surface of the floating gate layer. With the floating gate layer formed, a first, dry etch is performed into the floating gate layer to etch the floating gate layer back to below or about even with the upper surfaces of the STI regions, and to remove regions of the floating gate layer overlying the capping layer. Further, a second, wet etch is performed into the STI regions to etch the STI regions back relative to the floating gates. Subsequent to the dry etch, a third etch is performed into the remaining floating gate layer to from individual floating gates.

By using the dry etch instead of a CMP, a more uniform floating gate thickness is advantageously achieved from a center of a floating gate array to an edge of the floating gate array (i.e., from a center of the memory region to an edge of the memory region). Even more, the coupling ratio between the floating gates and neighboring erase gates is advantageously improved, thereby increasing erase speed and reducing power consumption during erases. The dry etch does not remove the concave recesses, and the wet etch exposes protrusions of the floating gates, which increase electric field strength and coupling at the protrusions. Moreover, the residue window is advantageously controlled better.

With reference to FIG. 1A, a cross-sectional view 100A of some embodiments of an embedded flash memory device is provided. The embedded flash memory device includes an array of memory cell devices 102 and an array of logic devices 104 arranged around the memory cell array, typically in a ring. The memory cell devices 102 of the array are typically ESF3 memory cell devices, but other types of memory cell devices are amenable. The logic devices 104 are typically transistors arranged to define address decoders, read/write circuitry, and/or other circuitry supporting operating of the embedded flash memory device.

A semiconductor substrate 106 supports the memory cell array and the logic device array. The semiconductor substrate 106 includes a memory region 108, an isolation region 110, and a logic region 112. The memory region 108 supports the array of memory cell devices 102, and is typically square-shaped or rectangle-shaped. The isolation region 110 laterally surrounds the memory region 108 to space and isolate the memory region 108 from the logic region 112. The isolation region 110 includes one or more inter-region STI regions 114 extending into the semiconductor substrate 106, typically from about even with an upper surface 116 of the semiconductor substrate 106. Further, in some embodiments, the isolation region 110 and/or the one or more inter-region STI regions 114 are ring-shaped and/or otherwise surround the memory region 108. The logic region 112 supports the logic devices 104, and laterally surrounds the isolation region 110 and the memory region 108. Typically, the logic region 112 is ring-shaped. The semiconductor substrate 106 may be, for example, a bulk semiconductor substrate or a silicon-on-insulator (SOI) substrate.

Memory STI regions 118 extend into the memory region 108. The memory STI regions 118 are laterally spaced over the memory region 108. Further, the memory STI regions 118 are typically line-shaped and typically arranged in parallel. In some embodiments, the size (e.g., width and/or depth) of the memory STI regions 118 may be less than the size of the inter-region STI regions 114. The memory STI regions 118 have upper surfaces 120 elevated relative to the upper surface 116 of the semiconductor substrate 106. Because the upper surfaces 120 of the memory STI regions 118 are elevated relative to the upper surface 116 of the semiconductor substrate 106, memory gaps 122 are defined between the memory STI regions 118. Memory cell dielectric layers 124 corresponding to the memory cell devices 102 are arranged over the memory region 108 in the memory gaps 122 between the memory STI regions 118. The memory cell dielectric layers 124 are arranged over memory inversion channel regions 126 corresponding to the memory cell devices 102. The memory cell dielectric layers 124 may be, for example, an oxide, such as silicon dioxide.

Floating gates 128 corresponding to the memory cell devices 102 are arranged over the memory cell dielectric layers 124 in the memory gaps 122. The floating gates 128 are a conductive material, such as, for example, metal or doped polysilicon. Upper surfaces 130 of the floating gates 128 are concave and elevated relative to the upper surfaces 120 of the memory STI regions 118. Because the upper surfaces 130 of the floating gates 128 are concave and elevated relative to the memory STI regions 118, protrusions or tips 132 extend along and/or around the edges of the upper surfaces 130. The protrusions or tips 132 advantageously increase the coupling with erase gates (not shown) to increase erase speed and/or reduce power consumption during erases. As those skilled in the art will appreciate, this follows because electric fields concentrate at the highest radiuses of curvature.

A control gate 134 is arranged over the floating gates 128 and extends laterally across the floating gates 128. The control gate 134 is a conductive material, such as, for example, metal or doped polysilicon. The control gate 134 is spaced from the floating gates 128 and the memory STI regions 118 by an inter-gate dielectric layer 136, and masked by a memory hard mask layer 138 and/or a spacer layer 139. The inter-gate dielectric layer 136 is typically a conformal layer lining the memory STI regions 118 and the floating gates 128. Further, the inter-gate dielectric layer 136 is typically a multi-layer oxide-nitride-oxide (ONO) film. The multi-layer ONO film includes a pair oxide layers stacked on opposing sides of a nitride layer. The memory hard mask layer 138 may be, for example, silicon nitride or silicon dioxide. The spacer layer 139 may be, for example, a multi-layer ONO film.

Logic STI regions 140 extend into the logic region 112, typically from about even with the upper surface 116 of the semiconductor substrate 106. The logic STI regions 140 are laterally spaced over the logic region 112. Further, the logic STI regions 140 are typically ring-shaped and typically surround the memory region 108 and the isolation region 110. In some embodiments, the size (e.g., width and/or depth) of the logic STI regions 140 is smaller than the size of the memory STI regions 118 because the logic devices 104 typically use less device area, are typically higher speed, and are typically more tolerant to leakage current than the memory devices 102. Logic gates 142 corresponding to the logic devices 104 are arranged between the logic STI regions 140 over logic inversion channel regions 143 corresponding to the logic devices 104. The logic gates 142 are a conductive material, such as, for example, metal or doped polysilicon. Further, the logic gates 142 are spaced from the logic region 112 by corresponding logic dielectric layers 144. The logic dielectric layers 144 may be, for example, an oxide, such as silicon dioxide, or a high κ dielectric (i.e., a dielectric with a dielectric constant greater than about 3.9). Further, the logic gates 142 are masked by corresponding logic hard mask layers 146. The logic hard mask layers 146 may be, for example, silicon nitride or silicon dioxide.

A contact etch stop layer 148 lines the semiconductor substrate 106, the memory cell devices 102, and the logic devices 104. Further, an interlayer dielectric (ILD) layer 150 is arranged over the contact etch stop layer 148. Although not shown by the illustrated view, contacts extend through the ILD layer 150 and the contact etch stop layer 148 to the memory cell devices 102 and the logic devices 104. The contact etch stop layer 148 may include one or more dielectric layers of, for example, silicon nitride and silicon dioxide. The ILD layer 150 may be, for example, a low κ dielectric (i.e., a dielectric with a dielectric constant less than about 3.9) or an oxide, such as silicon dioxide.

Figure 1B:
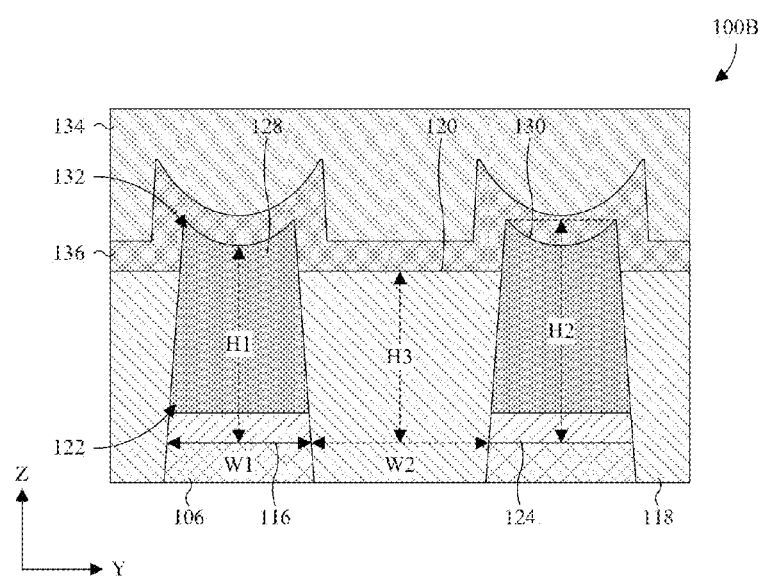
FIG. 1B illustrates an enlarged cross-sectional view of some embodiments of the embedded flash memory device of FIG. 1A.

With reference to FIG. 1B, an enlarged cross-sectional view 100B of some embodiments of the embedded flash memory device of FIG. 1A is provided. Floating gates 128 are spaced over a semiconductor substrate 106 between memory STI regions 118, and spaced from the semiconductor substrate 106 by corresponding memory cell dielectric layers 124. In some embodiments, the floating gates 128 have a width W1 of about 450-650 angstroms, and/or the memory STI regions 118 have a width W2 of about 400-600 angstroms. The floating gates 128 have concave upper surfaces 130 elevated relative to upper surfaces 120 of the memory STI regions 118, which are elevated relative to an upper surface 116 of the semiconductor substrate 106. In some embodiments, the centers of the concave upper surfaces 130 are elevated above the upper surface 116 of the semiconductor substrate 106 by a height H1 of about 325-375 angstroms, and/or the edges of the concave upper surfaces 130 are elevated above the upper surface 116 of the semiconductor substrate 106 by a height H2 of about 375-425 angstroms. Further, in some embodiments, the upper surfaces 120 of the memory STI regions 118 are elevated above the upper surface 116 of the semiconductor substrate 106 by a height H3 of about 275-325 angstroms.

Figure 1C:
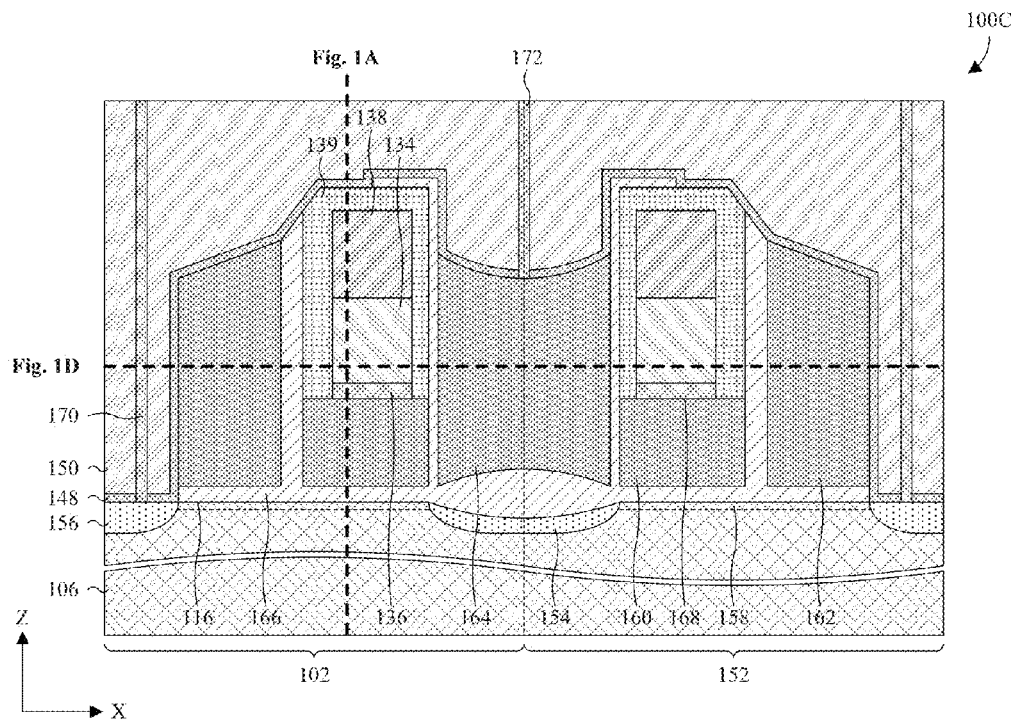
FIG. 1C illustrates a cross-sectional view of some embodiments of the embedded flash memory device of FIG. 1A, wherein the cross-sectional view of FIG. 1C is orthogonal to the cross-sectional view of FIG. 1A.

With reference to FIG. 1C, a cross-sectional view 100C of some embodiments of the embedded flash memory device is provided. The cross-sectional view 100C is orthogonal to the cross-sectional view 100A of FIG. 1A. The embedded flash memory device includes a first memory cell device 102 and a second memory cell device 152 supported by a semiconductor substrate 106. The semiconductor substrate 106 includes a common source/drain region 154 and individual source/drain regions 156. The individual source/drain regions 156 are individual to the first and second memory cell devices 102, 152, and arranged on opposing sides of the common source/drain region 154. Further, the semiconductor substrate 106 includes memory inversion channel regions 158 corresponding to the first and second memory cell devices 102, 152, and extending along an upper surface 116 of the semiconductor substrate 106 between the common source/drain region 154 and the individual source/drain regions 156.

Floating gates 160 and word lines 162 corresponding to the first and second memory cell devices 102, 152 are arranged over the memory inversion channel regions 158 of the corresponding memory cell devices 102, 152, and an erase gate 164 is arranged over the common source/drain region 154. The word lines 162 are arranged between the individual source/drain regions 156 and the floating gates 160 of the corresponding memory cell devices 102, 152, and the erase gate 164 is arranged between the floating gates 160. The word lines 162, the floating gates 160, and the erase gate 164 are spaced from the semiconductor substrate 106 and from each other by a memory cell dielectric layer 166. The word lines 162, the erase gate 164, and the floating gates 160 may be conductive materials, such as, for example, metal or doped polysilicon. The memory cell dielectric layer 166 may be, for example, an oxide, such as silicon dioxide.

Control gates 134 and spacer layers 139 corresponding to the first and second memory cell device 102, 152 are arranged over the floating gates 160 of the corresponding memory cell devices 102, 152. The control gates 134 are spaced from the floating gates 160 of the corresponding memory cell devices 102, 152 by inter-gate dielectric layers 136 corresponding to the to the first and second memory cell devices 102, 152. Further, the control gates 134 are masked by memory hard mask layers 138 corresponding to the first and second memory cell devices 102, 152. The spacer layers 139 extend from upper surfaces 168 of the floating gates 160 to line sidewalls of the memory hard mask layers 138, the control gates 134, and the inter-gate dielectric layers 136.

A contact etch stop layer 148 lines the semiconductor substrate 106 and the first and second memory cell devices 102, 152, and an ILD layer 150 is arranged over the contact etch stop layer 148. Further, contacts 170, 172 extend through the ILD layer 150 and the contact etch stop layer 148 to the memory cell devices 102, 152. For example, a first contact 170 may extend to an individual source/drain region 156, and a second contact 172 may extend to the erase gate 164. The contact etch stop layer 148 may include one or more dielectric layers of, for example, silicon nitride and silicon dioxide. The ILD layer 150 may be, for example, a low κ dielectric. The contacts 170, 172 may be a metal, such as, for example, aluminum copper.

In operation, the floating gates 160 store different amounts of charge representing different data states (e.g., a binary "1" and a binary "0"). Read operations are performed to determine the data states of the floating gates 160, and program and erase operations are performed to change data states of the floating gates 160.

Regarding read operations, the control gates 134 and the word lines 162 serve as transistor gates for the underlying memory inversion channel regions 158. Further, charge stored in the floating gates 160 screens electric fields between the control gates 134 and the memory inversion channel regions 158 to change the threshold voltages for the control gates 134 by an amount $\Delta V_{thr}$. Therefore, the data state of a floating gate can be determined by measuring the resistance of the underlying inversion channel region when the corresponding word line is biased with a voltage exceeding a word line threshold voltage, and the corresponding control gate is biased with a voltage $V_{thr}<V<V_{thr}+\Delta V_{thr}$.

Regarding program and erase operations, electric fields are produced by the control gates 134 and the erase gate 164 to promote the tunneling of charge into and/or out of the floating gates 160. Typically, program operations are carried out using source-side injection (SSI), and erase operations are carried out using Fowler-Nordheim tunneling (FNT) to the erase gate 164. However, it is to be appreciated that program operations may also be performed using FNT. One challenge with FNT is that it is typically slow compared to SSI. The protrusions or tips 132 (see FIGS. 1A & B) of the floating gates 160 advantageously concentrate electric fields and increase the speed of FNT.

Figure 1D:
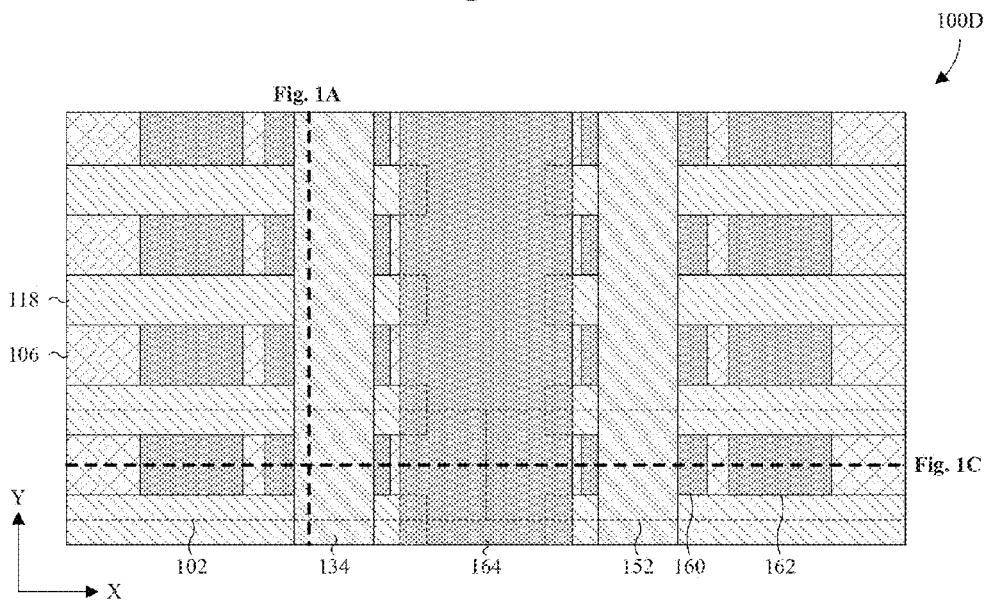
FIG. 1D illustrates a top view of some embodiments of the embedded flash memory device of FIG. 1A.

With reference to FIG. 1D, a top view 100D of some embodiments of the embedded flash memory device of FIG. 1A is provided. The embedded flash memory device includes an array of memory cell devices arranged in rows and columns. First and second memory cell devices 102, 152 are labeled. The memory cell devices 102, 152 are supported by a semiconductor substrate 106, and the memory cell devices 102, 152 are arranged between an array of memory cell STI regions 118 in the semiconductor substrate 106. The memory cell STI regions 118 are arranged in rows and columns in the semiconductor substrate 106. Typically, the memory cell STI regions 118 include one more row than the memory cell devices 102, 152. For example, as illustrated, the memory cell STI regions 118 include four rows and two columns, and the memory cell devices 102, 152 include three rows and two columns.

Word lines 162 and floating gates 160 individual to the memory cell devices 102, 152 are arranged in rows and columns between the memory cell STI regions 118, and an erase gate 164 common to the memory cell devices 102, 152 is arranged between the floating gates 160. Although not shown, in embodiments having additional columns of memory cell devices, the columns are typically paired and erase gates individual to the pairs are arranged between the columns of the pairs. Further, control gates 134 individual to the columns of memory cell devices are arranged over the floating gates 160.

Figure 2:
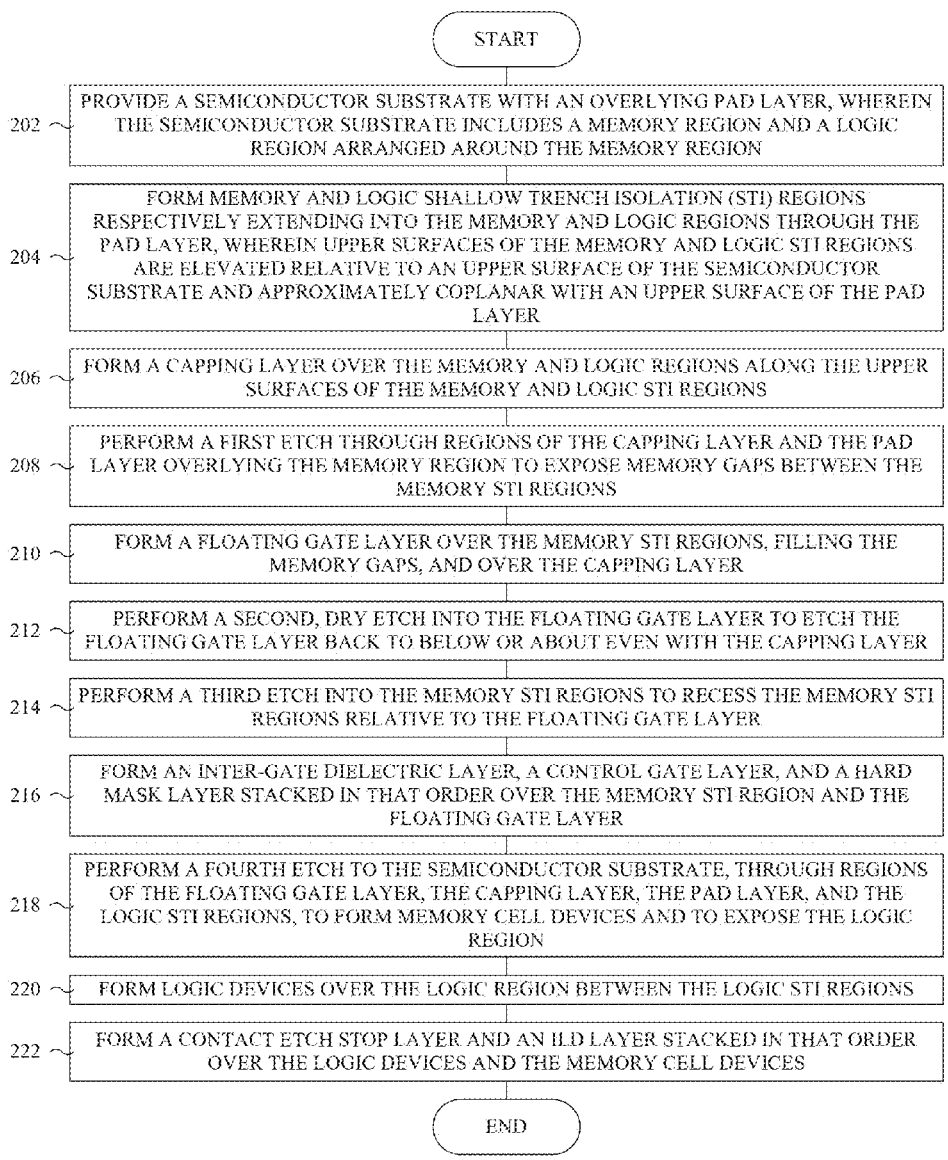
FIG. 2 illustrates a flowchart of some embodiments of a method for manufacturing an embedded flash memory device.

With reference to FIG. 2, a flowchart 200 provides some embodiments of a method for manufacturing an embedded flash memory device.

At 202, a semiconductor substrate with an overlying pad layer is provided. The semiconductor substrate includes a memory region and a logic region arranged around the memory region.

At 204, memory and logic shallow trench isolation (STI) regions are respectively formed extending into the memory and logic regions through the pad layer. Upper surfaces of the memory and logic STI regions are elevated relative to an upper surface of the semiconductor substrate and approximately coplanar with an upper surface of the pad layer.

At 206, a capping layer is formed over the memory and logic regions along the upper surfaces of the memory and logic STI regions.

At 208, a first etch is performed through regions of the capping layer and the pad layer overlying the memory region to expose memory gaps between the memory STI regions. Advantageously, the remaining capping layer allows improvements in the process window.

At 210, a floating gate layer is formed over the memory STI regions, filling the memory gaps, and over the capping layer. Typically, the floating gate layer has an upper surface with concave recesses over the memory gaps.

At 212, a second, dry etch is performed into the floating gate layer to etch the floating gate layer back to below or about even with the capping layer. The dry etch advantageously does not remove the concave recesses. Further, the dry etch advantageously results in a relative uniform thickness in the remaining floating gate layer.

At 214, a third etch is performed into the memory STI regions to recess the memory STI regions relative to the floating gate layer. In embodiments with concave recesses in the upper surface of the floating gate layer, the third etch results in protrusions or tips around the peripheries of the memory gaps. The protrusions or tips advantageously increase coupling with erase gates for faster erase speeds and/or reduced power consumption during erases.

At 216, an inter-gate dielectric layer, a control gate layer, and a hard mask layer are formed stacked in that order over the memory STI regions and the floating gate layer.

At 218, a fourth etch is performed to the semiconductor substrate, through regions of the floating gate layer, the capping layer, the pad layer, and the logic STI regions, to form memory cell devices and to expose the logic region.

At 220, logic devices are formed over the logic region between the logic STI regions.

At 222, a contact etch stop layer and an ILD layer are formed stacked in that order over the logic devices and the memory cell devices.

While the disclosed method (e.g., the method described by the flowchart 200) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-16, cross-sectional views of some embodiments of an embedded flash memory device at various stages of manufacture are provided to illustrate the method of FIG. 2. Although FIGS. 3-16 are described in relation to the method, it will be appreciated that the structures disclosed in FIGS. 3-16 are not limited to the method, but instead may stand alone as structures independent of the method. Similarly, although the method is described in relation to FIGS. 3-16, it will be appreciated that the method is not limited to the structures disclosed in FIGS. 3-16, but instead may stand alone independent of the structures disclosed in FIGS. 3-16.

Figure 3:
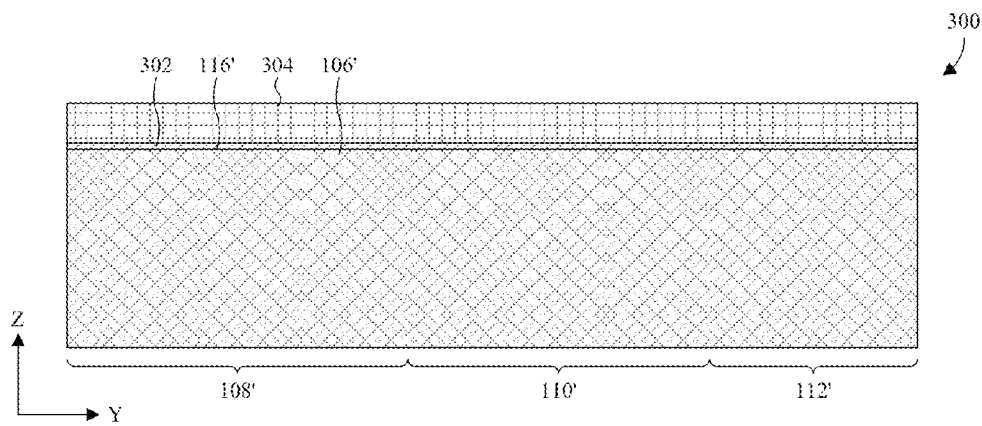
FIGS. 3-16 illustrate a series of cross-sectional views of some embodiments of an embedded flash memory device at various stages of manufacture.

FIG. 3 illustrates a cross-sectional view 300 of some embodiments corresponding to Act 202. As illustrated, a semiconductor substrate 106' with a memory region 108', an isolation region 110', and a logic region 112' is provided. The memory region 108' is typically square-shaped or rectangle-shaped. The isolation region 110' laterally surrounds the memory region 108' to space and isolate the memory region 108' from the logic region 112'. In some embodiments, the isolation region 110' is ring-shaped. The logic region 112' laterally surrounds the isolation region 110' and the memory region 108'. Typically, the logic region 112' is ring-shaped. The semiconductor substrate 106' may be, for example, a bulk semiconductor substrate or a silicon-on-insulator (SOI) substrate.

Also illustrated, one or more pad layers 302, 304 are formed stacked over an upper surface 116' of the semiconductor substrate 106'. The one or more pad layers 302, 304 typically include a pad oxide layer 302 and an overlying pad nitride layer 304. Relative to the pad oxide layer 302, the pad nitride layer 304 is typically thicker. The one or more pad layers 302, 304 may be, for example, formed according to a deposition technique, such as chemical vapor deposition (CVD) or physical vapor deposition (PVD).

Figure 4:
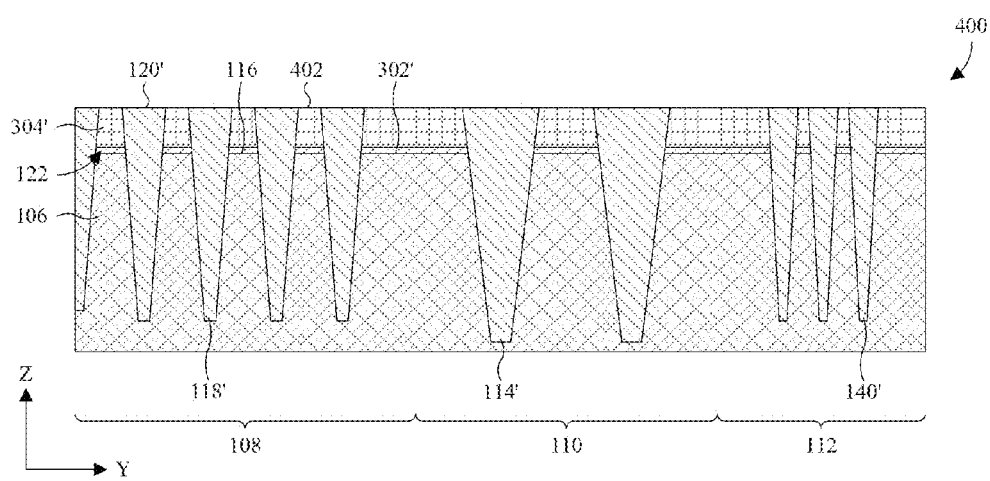

FIG. 4 illustrates a cross-sectional view 400 of some embodiments corresponding to Act 204. As illustrated, STI regions 118', 114', 140' are formed laterally spaced over the semiconductor substrate 106', and extending into the semiconductor substrate 106' through the one or more pad layers 302, 304. The STI regions 118', 114', 140' are formed with upper surfaces 120' elevated relative to the upper surface 116 of the remaining semiconductor substrate 106' and approximately coplanar with an upper surface 402 of an uppermost pad layer 304'. Because the upper surfaces 120' of the STI regions 118', 114', 140' are elevated relative to the upper surface 116 of the remaining semiconductor substrate 106', gaps 122 are defined between the STI regions 118', 114', 140'.

The STI regions 118', 114', 140' include memory STI regions 118', one or more inter-region STI regions 114', and logic STI regions 140' respectively extending into the memory region 108, the isolation region 110, and the logic region 112. The one or more inter-region STI regions 118' are typically ring-shaped, and typically arranged around the memory region 108.

The process for forming the STI regions 118', 114', 140' may include performing a selective etch into the semiconductor substrate 106', through the one or more pad layers 302, 304, to form trenches corresponding to the STI regions 118', 114', 140'. A dielectric layer may then be formed to fill the trenches using a deposition technique, such as CVD. Further, a CMP may be performed into the dielectric layer. The CMP may be performed to about even with the upper surface 402 of the uppermost pad layer 304'.

Figure 5:
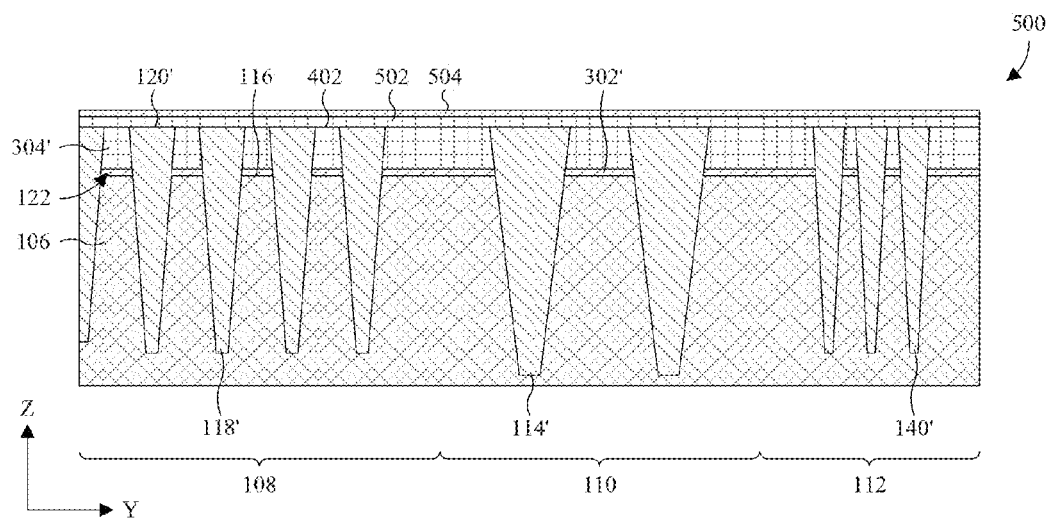

FIG. 5 illustrates a cross-sectional view 500 of some embodiments corresponding to Act 206. As illustrated, one or more capping layers 502, 504 are formed stacked over the upper surface 402 of the uppermost pad layer 304' and the upper surfaces 120' of the STI regions 118', 114', 140'. The one or more capping layers 502, 504 typically include a capping nitride layer 502 and an overlying capping oxide layer 504. The one or more capping layers 502, 504 may be, for example, formed according to a deposition technique, such as CVD.

Figure 6:
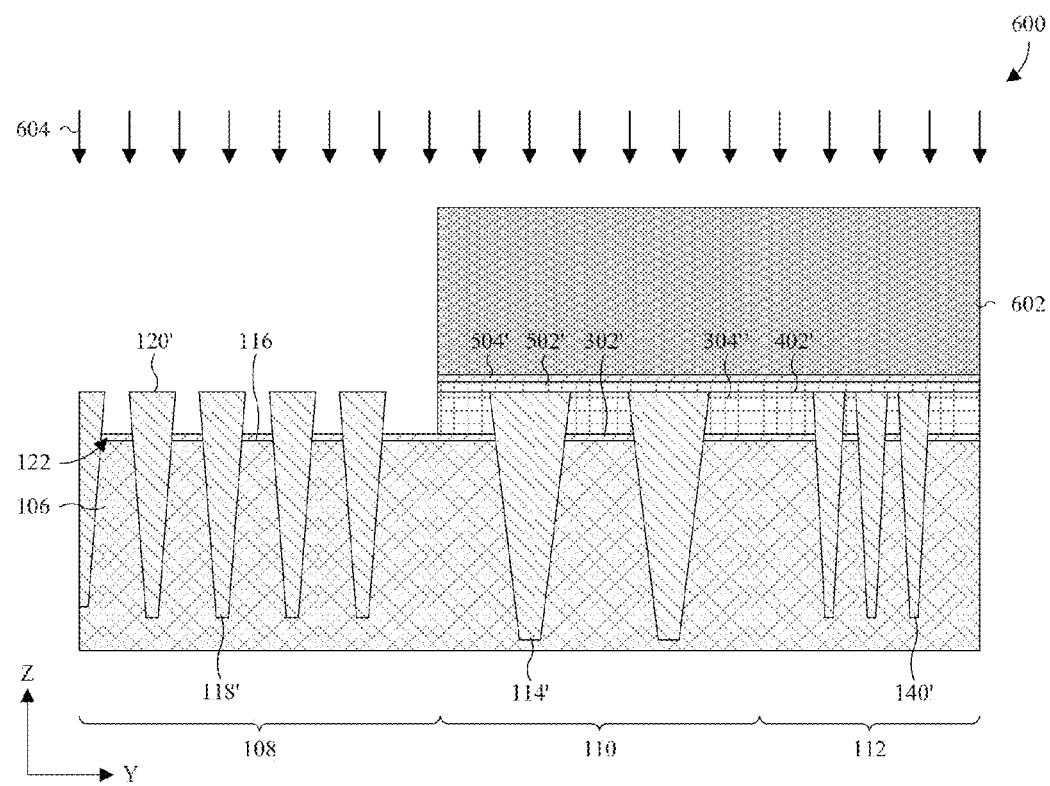

FIG. 6 illustrates a cross-sectional view 600 of some embodiments corresponding to Act 208. As illustrated, a first etch is performed through regions of the one or more capping layers 502, 504 and the one or more remaining pad layers 302', 304' overlying the memory region 108. In some embodiments, the first etch extends to, but not through, the remaining pad oxide layer 302'. The first etch exposes memory gaps 122 between the memory STI regions 118'. The process for performing the first etch may include forming a first photoresist layer 602 masking the isolation and logic regions 110, 112. Further, one or more etchants 604 may be applied to the one or more capping layers 502, 504 and the one or more remaining pad layers 302', 304' according to the first photoresist layer 602. Thereafter, the first photoresist layer 602 may be removed.

Figure 7:
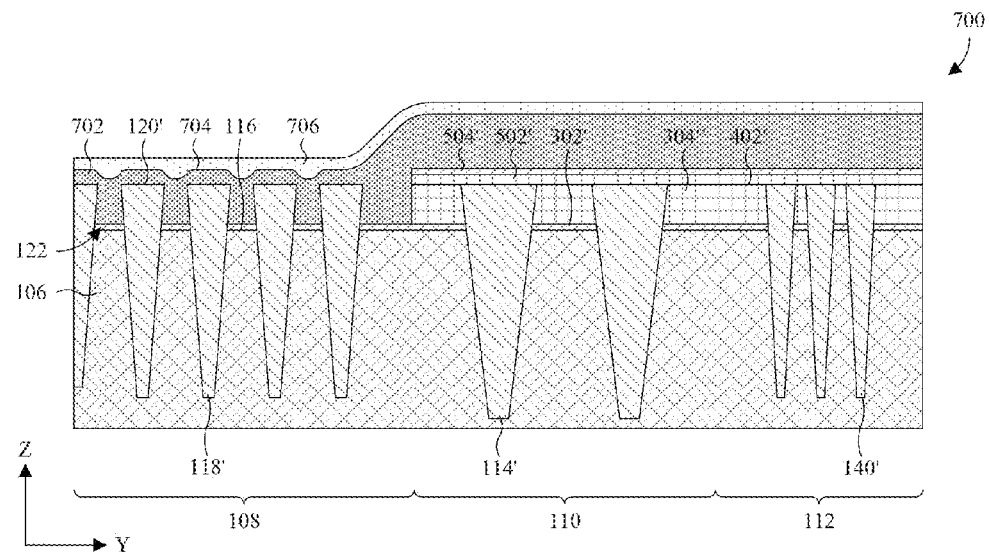

FIG. 7 illustrates a cross-sectional view 700 of some embodiments corresponding to Act 210. As illustrated, a floating gate layer 702 is formed over the upper surface 402' of the remaining uppermost pad layer 304'' and over the one or more remaining capping layers 502', 504'. Further, the floating gate layer 702 is formed filling the memory gaps 122. Due to the memory gaps 122, an upper surface 704 of the floating gate layer 702 typically has concave recesses over the memory gaps 122. In some embodiments, the depth of the concave recesses is about 10-100 angstroms. The floating gate layer 702 may be formed using as a conductive material, such as metal or doped polysilicon. Further, the floating gate layer 702 may be formed using a conformal deposition technique, such as CVD.

Also illustrated by FIG. 7, a bottom anti-reflective coating (BARC) 706 is formed over the floating gate layer 702. Typically, the BARC 706 is an organic anti-reflective coating.

Figure 8:
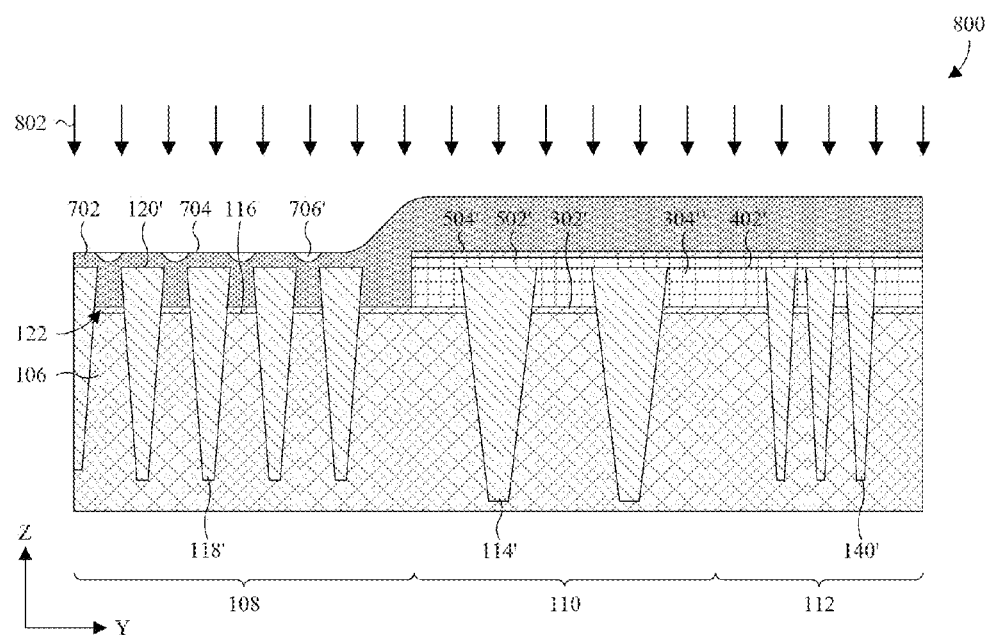
Figure 9:
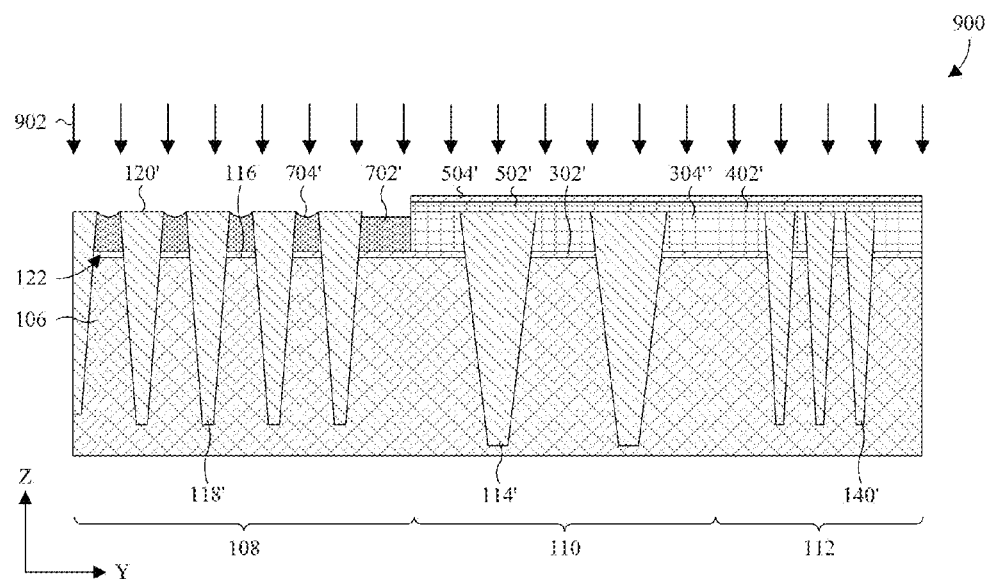

FIGS. 8 and 9 illustrate cross-sectional views 800, 900 of some embodiments corresponding to Act 212.

As illustrated by FIG. 8, a second etch is performed into the BARC 706 to etch the BARC 706 back to the floating gate layer 702. After the second etch, the remaining BARC 706' is limited to the concave recesses in the upper surface 704 of the floating gate layer 702. The second etch is typically a dry etch. Further, the process for performing the second etch may include applying an etchant 802, such as a dry etchant or plasma, to the BARC 706.

As illustrated by FIG. 9, a third etch is performed into the floating gate layer 702 to etch the floating gate layer 702 back to the memory STI regions 118'. During the third etch, the remaining BARC 706' protects the concave recesses in the upper surface 704 of the floating gate layer 702 to ensure the concave recesses persist after the third etch. The third etch removes the remaining BARC 706 and removes regions of the floating gate layer 702 overlying the isolation and logic regions 110, 112. The third etch is typically a dry etch. Further, the process for performing the third etch may include applying an etchant 902, such as a dry etchant or plasma, to the floating gate layer 702. Notably, the one or more remaining capping layers 502', 504' protect the isolation and logic regions 110, 112 during the third etch.

Figure 10:
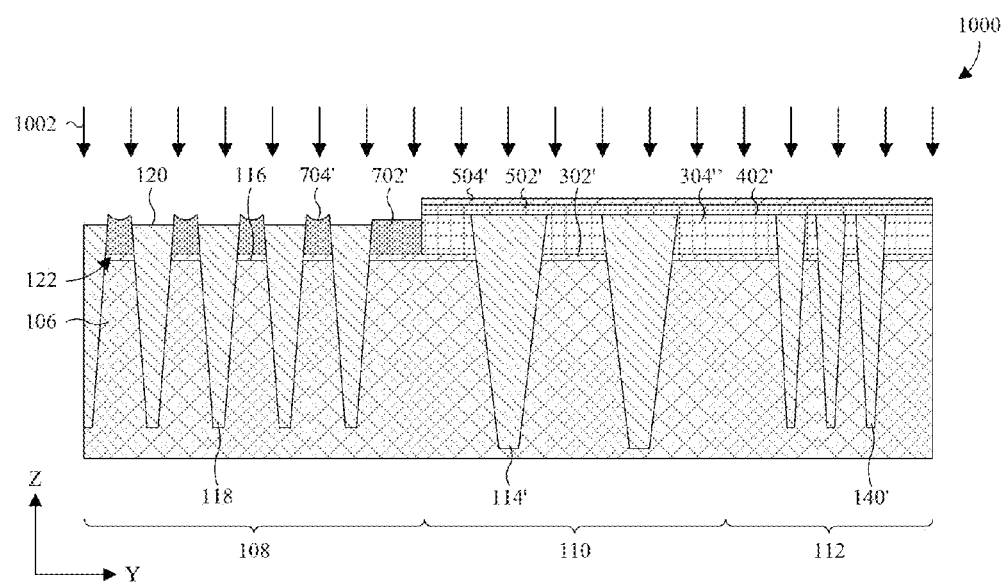

FIG. 10 illustrates a cross-sectional view 1000 of some embodiments corresponding to Act 214. As illustrated, a fourth etch is performed into the memory STI regions 118' to etch back the memory STI regions 118' to below the upper surface 704' of the remaining floating gate layer 702'. The fourth etch is typically a wet etch. Further, the process for performing the fourth etch may include applying an etchant 1002, such as a wet etchant, to the memory STI regions 118'. Notably, the one or more remaining capping layers 502', 504' protect the isolation and logic regions 110, 112 during the fourth etch.

Figure 11:
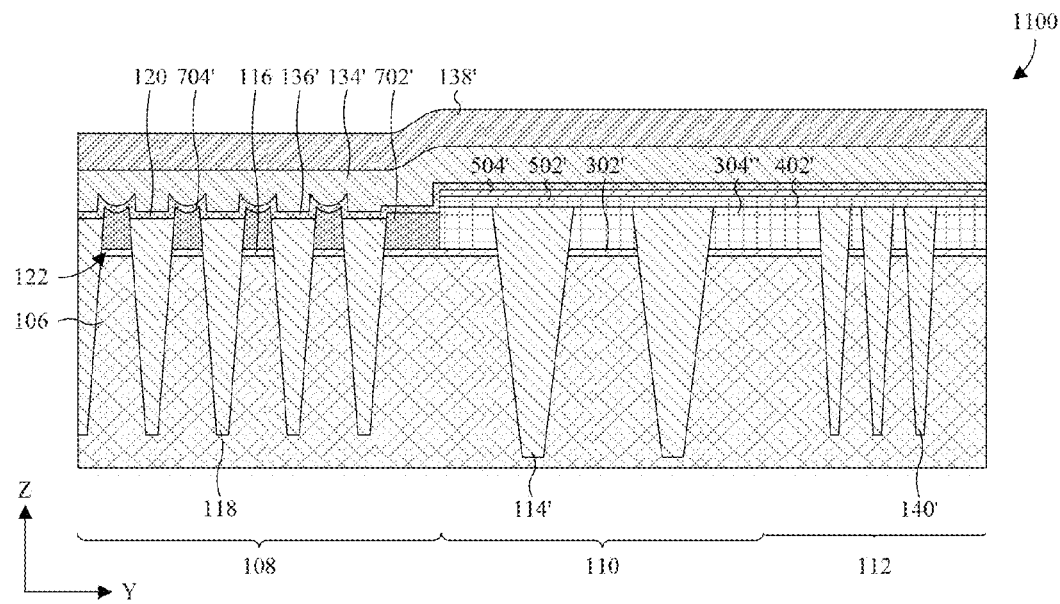

FIG. 11 illustrates a cross-sectional view 1100 of some embodiments corresponding to Act 216. As illustrated, an inter-gate dielectric layer 136', a control gate layer 134', and a memory hard mask layer 138' are formed stacked over the remaining floating gate layer 702' and the one or more remaining capping layers 502', 504'. The inter-gate dielectric layer 136' is typically formed conformally lining the remaining floating gate layer 702'. Further, the inter-gate dielectric layer 136' is typically formed of a multi-layer ONO film. The control gate layer 134' is formed over the inter-gate dielectric layer 136', and the memory hard mask layer 138' is formed over the control gate layer 134'. The control gate layer 134' is typically formed of a conductive material, such as doped polysilicon, and the memory hard mask layer 138' is typically formed of a nitride, such as silicon nitride. The inter-gate dielectric layer 136', the control gate layer 134', and the memory hard mask layer 138' may be formed using a deposition technique, such as CVD.

Figure 12:
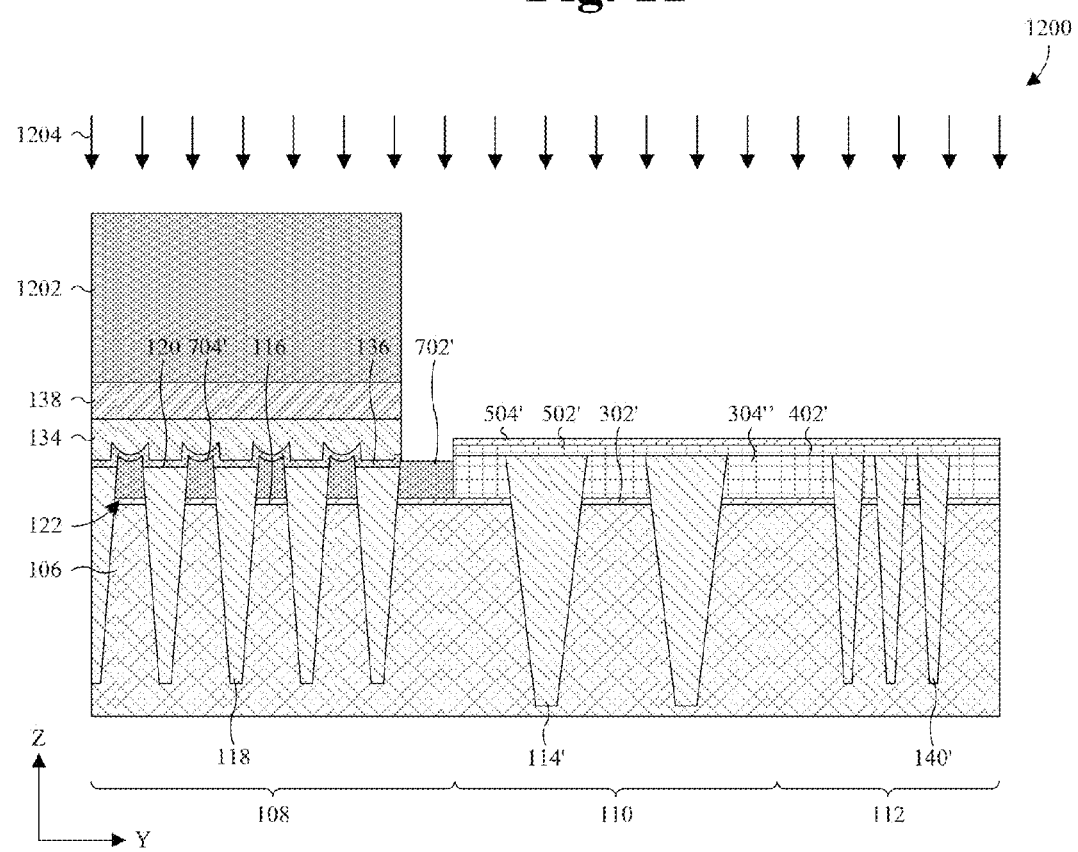
Figure 13:
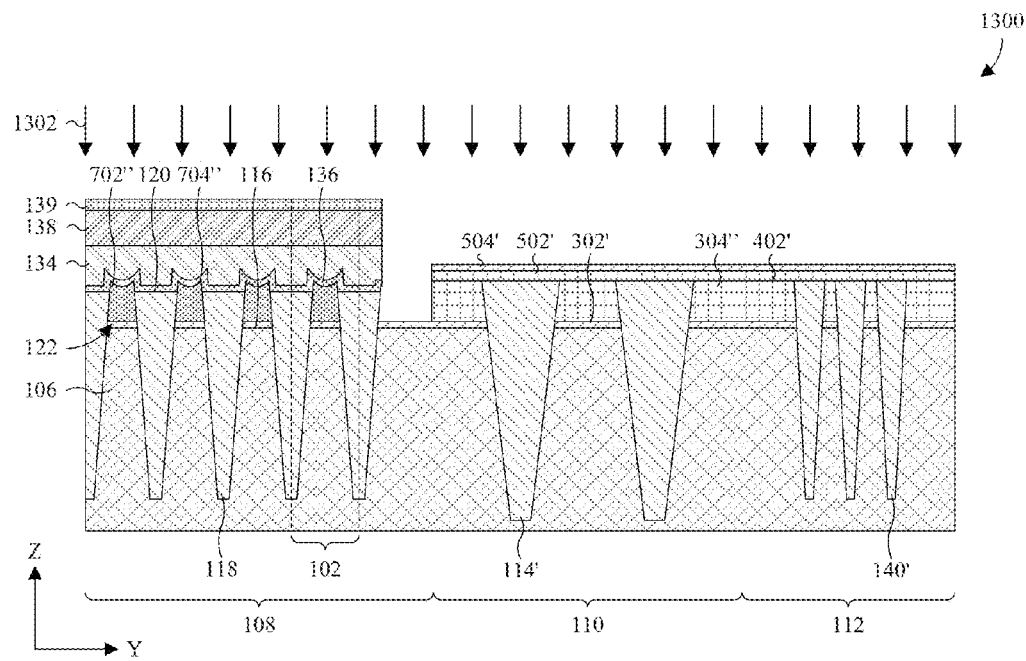
Figure 14:
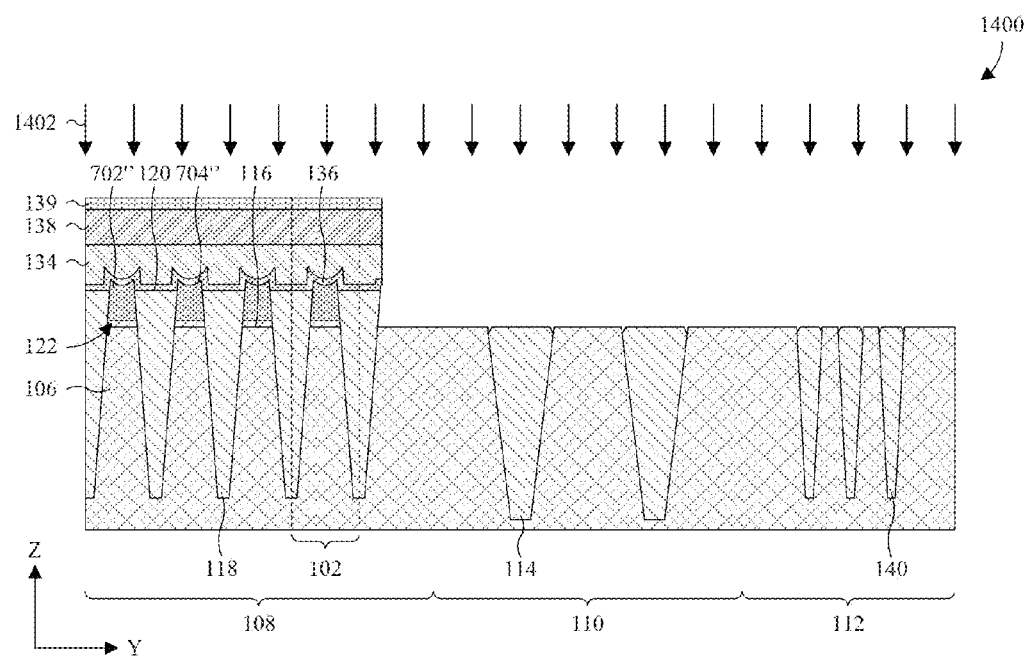

FIGS. 12-14 illustrate cross-sectional views 1200, 1300, 1400 of some embodiments corresponding to Act 218.

As illustrated by FIG. 12, a fifth etch is performed to the remaining floating gate layer 702' and the one or more remaining capping layers 502', 504', through regions of the memory hard mask layer 138', the control gate layer 134', and the inter-gate dielectric layer 136' surrounding the remaining memory STI regions 118. The fifth etch removes regions of the memory hard mask layer 138', the control gate layer 134', and the inter-gate dielectric layer 136' overlying the one or more remaining capping layers 502', 504'. The process for performing the fifth etch may include forming a second photoresist layer 1202 masking the remaining memory STI regions 118 and regions of the remaining floating gate layer 702' between the remaining memory STI regions 118. Further, one or more etchants 1204 may be applied to the memory hard mask layer 138', the control gate layer 134', and the inter-gate dielectric layer 136' according to the second photoresist layer 1202. Thereafter, the second photoresist layer 1202 may be removed. Notably, the one or more remaining capping layers 502', 504' protect the isolation and logic regions 110, 112 during the fifth etch.

As illustrated by FIG. 13, a sixth etch is performed through regions of the remaining floating gate layer 702' unmasked by the remaining memory hard mask layer 138. The sixth etch results in memory cell devices 102 between the remaining memory STI regions 118. The process for performing the sixth etch may include applying one or more etchants 1302 to exposed regions of the remaining floating gate layer 702'. Notably, the one or more remaining capping layers 502', 504' protect the isolation and logic regions 110, 112 during the sixth etch. In some embodiments, a spacer layer 139 is formed over the remaining memory hard mask layer 138 before performing the sixth etch. The spacer layer 139 may be, for example, formed as a multi-layer ONO film.

As illustrated by FIG. 14, a seventh etch is performed into regions of the one or more remaining capping layers 502', 504' and the one or more remaining pad layers 302', 304" overlying the isolation and logic regions 110, 112. This, in turn, removes the one or more remaining capping layers 502', 504' and regions of the one or more remaining pad layers 302', 304" exposed or otherwise overlying the isolation and logic regions 110, 112. The seventh etch is further performed into the one or more inter-region STI regions 114' and the logic STI regions 140' to etch the one or more inter-region STI regions 114' and the logic STI regions 140' back to about even with the upper surface 116 of the semiconductor substrate 106, thereby forming remaining inter-gate STI regions 114 and remaining logic STI regions 140.

The process for performing the seventh etch may include applying one or more etchants to the one or more remaining capping layers 502', 504' and the one or more remaining pad layers 302', 304". Thereafter, one or more additional etchants 1402, such as wet etchants, may be applied to the one or more inter-region STI regions 114' and the logic STI regions 140'. In some embodiments, a protective layer (not shown), such as an oxide layer, is formed masking the semiconductor structure over the memory region 108 before carrying out the foregoing.

Figure 15:
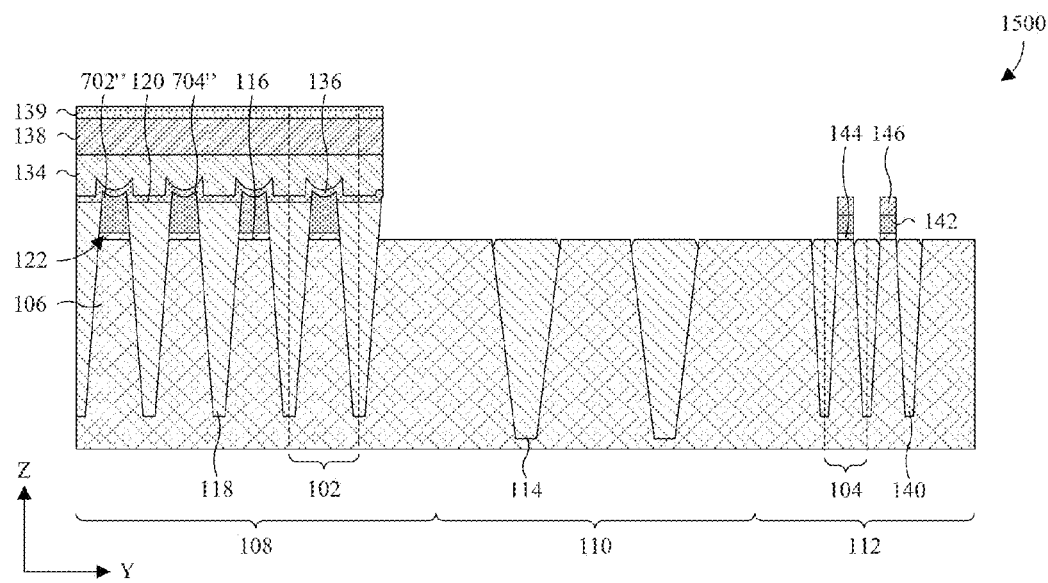

FIG. 15 illustrates a cross-sectional view 1500 of some embodiments corresponding to Act 220. As illustrated, logic devices 104 are formed over the logic region 112 between the logic STI regions 140. The logic devices 104 include logic gates 142, logic dielectric layers 144, and logic hard mask layers 146. The logic hard mask layers 146 mask the logic gates 142, and the logic dielectric layers 144 space the logic gates 142 from the semiconductor substrate 106. The process for forming the logic devices 104 may include forming an intermediate logic dielectric layer, an intermediate logic gate layer, and an intermediate logic hard mask layer stacked in that order over the logic region 112. The intermediate layers may then be patterned through a selective etching process to define the logic gates 142, the logic gate dielectric layers 144, and the logic hard mask layers 146.

Figure 16:
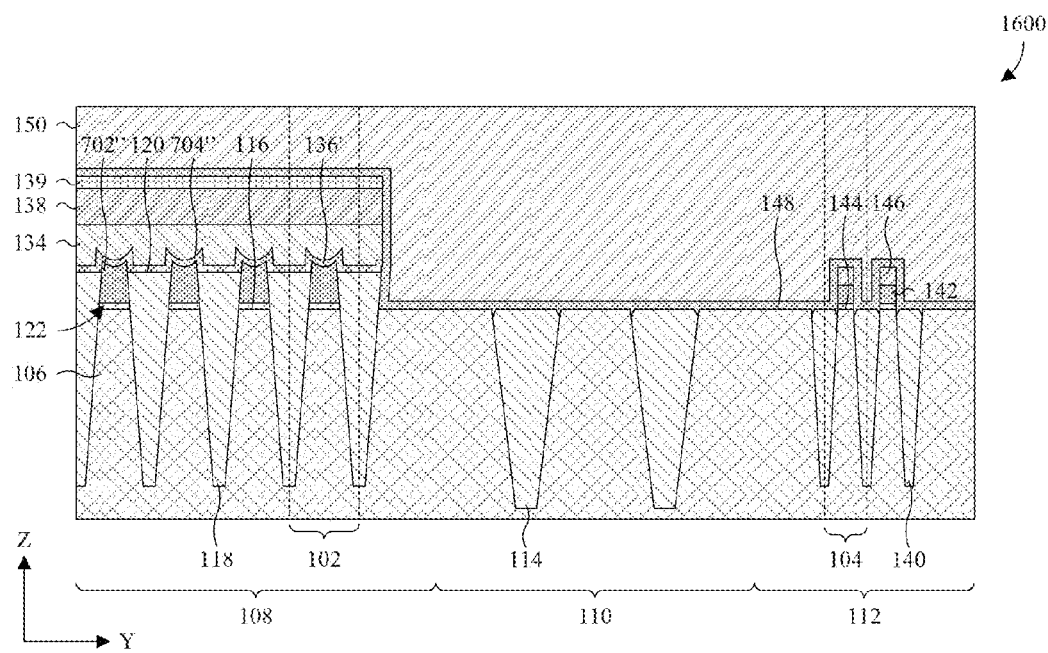

FIG. 16 illustrates a cross-sectional view 1600 of some embodiments corresponding to Act 222. As illustrated, a contact etch stop layer 148 is formed conformally over the semiconductor structure, along the upper surface 704" of the remaining floating gate layer 702". Further, an ILD layer 150 is formed over the contact etch stop layer 148, and contacts (not shown) are formed extending through the ILD layer 150.

Thus, as can be appreciated from above, the present disclosure provides a method for manufacturing an embedded flash memory device. Memory and logic STI regions respectively extend into memory and logic regions of a semiconductor substrate. The memory and logic STI regions have upper surfaces approximately coplanar with an upper surface of a pad layer overlying the semiconductor substrate. A capping layer is formed overlying the logic region of the semiconductor substrate. A first etch is performed into the pad layer, through regions of the pad layer overlying the memory region of the semiconductor substrate, to expose memory gaps between the memory STI regions. A floating gate layer is formed filling the memory gaps and overlying the capping layer. A second, dry etch is performed into the floating gate layer to etch the floating gate layer back to below or about even with upper surfaces of the capping layer and the memory STI regions. A third etch is performed into the memory STI regions to recess the memory STI regions relative to the floating gate layer. A fourth etch is performed into the floating gate layer to form an array of floating gates from the floating gate layer.

In other embodiments, the present disclosure provides an embedded flash memory device. Memory and logic STI regions respectively extend into memory and logic regions of a semiconductor substrate. The memory STI regions have upper surfaces elevated relative to an upper surface of the semiconductor substrate. The logic STI regions have upper surfaces approximately coplanar with the upper surface of the semiconductor substrate. An array of memory cell devices are arranged between the memory STI regions in rows and columns. The memory cell devices include floating gates and control gates overlying the floating gates. The floating gates have uniform thicknesses from a center of the array to an edge of the array. The floating gates have concave upper surfaces elevated relative to the upper surfaces of the memory STI regions. Logic devices are arranged between the logic STI regions.

In yet other embodiments, the present disclosure provides an embedded flash memory device including a pair of memory cell devices. A semiconductor substrate includes a common source/drain region common to the memory cell devices and individual source/drain regions individual to the memory cell devices. The individual source/drain regions are spaced laterally on opposing sides of the common source/drain region along a first axis. An erase gate is arranged over the common source/drain region. Floating gates correspond to the memory cell devices, and are arranged between the common source/drain region and the individual source/drain regions of the corresponding memory cell devices. Further, the floating gates are arranged between STI regions spaced laterally along a second axis, orthogonal to the first axis. The floating gates have a uniform thickness and concave upper surfaces elevated relative to upper surfaces of the STI regions. Word lines are arranged along the first axis between the floating gates and the individual source/drain regions. Control gates extend along the second axis and are arranged over the floating gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an embedded flash memory device, said method comprising:
   forming memory and logic shallow trench isolation (STI) regions respectively extending into memory and logic regions of a semiconductor substrate, wherein the memory and logic STI regions have upper surfaces approximately coplanar with an upper surface of a pad layer overlying the semiconductor substrate;
   forming a capping layer overlying the logic region of the semiconductor substrate;
   performing a first etch into the pad layer, through regions of the pad layer overlying the memory region of the semiconductor substrate, to expose memory gaps between the memory STI regions;
   forming a floating gate layer filling the memory gaps and overlying the capping layer;
   performing a second, dry etch into the floating gate layer to etch the floating gate layer back to below or about even with upper surfaces of the capping layer and the memory STI regions;
   performing a third etch into the memory STI regions to recess the memory STI regions relative to the floating gate layer; and
   performing a fourth etch into the floating gate layer to form an array of floating gates from the floating gate layer.

2. The method according to claim 1, further including:
   forming control gates over the floating gate layer;
   performing the fourth etch into the floating gate layer to form the floating gates underlying the control gates;
   performing a fifth etch into the capping layer and the pad layer to remove the capping layer and the pad layer over the logic region;
   performing a sixth etch into the logic STI regions to etch the logic STI regions back to about even with an upper surface of the semiconductor substrate; and
   forming logic devices over the logic region.

3. The method according to claim 2, further including:
   forming an inter-gate dielectric layer over the floating gate layer;
   forming a control gate layer over the inter-gate dielectric layer;
   forming a hard mask layer over the control gate layer; and
   performing a seventh etch through the inter-gate dielectric layer, the control gate layer, and the hard mask layer to form the control gates.

4. The method according to claim 2, further including:
   forming the floating gate layer with recesses overlying the memory gaps; and
   before performing the second etch, forming an antireflective coating filling the recesses.

5. The method according to claim 1, further including:
   forming the floating gates with a uniform thickness from a center of the array to an edge of the array.

6. The method according to claim 1, further including:
   forming the floating gate layer with recesses overlying the memory gaps; and
   performing the second, dry etch to etch a lowest point of the recesses back to about 325-375 angstroms above an upper surface of the semiconductor substrate.

7. The method according to claim 1, further including:
   forming the floating gate layer with recesses overlying the memory gaps; and
   performing the second, dry etch to etch a highest point of the recesses back to about 375-425 angstroms above an upper surface of the semiconductor substrate.

8. The method according to claim 1, further including:
   forming the floating gate layer with recesses overlying the memory gaps; and
   performing the third etch to recess upper surfaces of the memory STI regions about 25-100 angstroms below a lowest point of the recesses.

9. The method according to claim 1, further including:
   forming the memory STI regions laterally spaced by about 450-650 angstroms.

10. The method according to claim 1, further comprising:
    forming a control gate over the floating gate layer, wherein the fourth etch forms a first floating gate and a second floating gate both directly under the control gate, and wherein the control gate is continuous from the first floating gate to the second floating gate.

11. A method for manufacturing a flash memory device, said method comprising:
    forming first shallow trench isolation (STI) regions and second STI regions both extending into a semiconductor substrate, through a pad layer overlying the semiconductor substrate;
    performing a first etch into the pad layer to remove the pad layer between the first STI regions, while leaving the pad layer between the second STI regions;
    forming a floating gate layer filling gaps between the first STI regions, and further covering the first and second STI regions and the pad layer;
    performing a second etch into the floating gate layer to etch the floating gate layer back to below top surfaces of the first STI regions, and to remove the floating gate layer from over the second STI regions and the pad layer;
    forming a control gate over the floating gate layer; and
    performing a third etch into the floating gate layer, with the control gate in place, to form a floating gate under the control gate.

12. The method according to claim 11, wherein the first and second STI regions are formed with top surfaces that are even with a top surface of the pad layer.

13. The method according to claim 11, further comprising:
    forming a capping layer covering the first and second STI regions, and further covering the pad layer, wherein the first etch further removes the capping layer from over the first STI regions, while leaving the capping layer over the second STI regions.

14. The method according to claim 11, wherein the floating gate layer is formed with recesses directly over the gaps, and wherein the method further comprises:
    forming an antireflective coating covering the floating gate layer, wherein the second etch is performed into the antireflective coating and the floating gate layer simultaneously and removes the antireflective coating.

15. The method according to claim 11, further comprising:
    performing a fourth etch into the first STI regions to recess the top surfaces of the first STI regions to below a top surface of the floating gate layer, wherein the control gate is formed after the fourth etch.

16. The method according to claim 11, further comprising:
    after forming the floating gate, performing a fourth etch into the pad layer and the second STI regions to remove the pad layer and to recess top surfaces of the second STI to about even with a top surface of the semiconductor substrate; and
    forming a logic device between a neighboring pair of the second STI regions.

17. A method for manufacturing a flash memory device, said method comprising:
- forming trench isolation (TI) regions extending through a pad layer that covers a semiconductor substrate, into a first region of the semiconductor substrate;
- performing a first etch into the pad layer to remove the pad layer from the first region of the semiconductor substrate, while leaving the pad layer covering a second region of the semiconductor substrate;
- forming a floating gate layer filling gaps between the TI regions, and further covering the TI regions and the first and second regions of the semiconductor substrate;
- performing a second etch into the floating gate layer to etch the floating gate layer back to below top surfaces of the TI regions, and to remove the floating gate layer from the second region of the semiconductor substrate; and
- after the second etch, forming a logic device in the second region of the semiconductor substrate.

18. The method according to claim 17, further comprising:
- forming a capping layer covering the first and second regions of the semiconductor substrate, over the TI regions and the pad layer, wherein the first etch is performed into the capping layer to remove the capping layer from the first region of the semiconductor substrate, while leaving the capping layer covering the second region of the semiconductor substrate.

19. The method according to claim 17, further comprising:
- performing a third etch into the TI regions to recess the top surfaces of the TI regions to below a top surface of the floating gate layer;
- forming a control gate over the floating gate layer; and
- performing a fourth etch into the floating gate layer, with the control gate in place, to form a floating gate under the control gate.

20. The method according to claim 17, wherein forming the logic device comprises:
- performing a third etch into the pad layer to remove the pad layer from the second region of the semiconductor substrate; and
- forming a gate electrode over the second region of the semiconductor substrate.

* * * * *